United States Patent
Chen et al.

(10) Patent No.: US 11,652,310 B2
(45) Date of Patent: May 16, 2023

(54) STORAGE DEVICE WITH DETACHABLE CAPACITOR CONNECTION STRUCTURE

(71) Applicant: SK hynix Inc., Gyeonggi-do (KR)

(72) Inventors: Xiaofang Chen, Milpitas, CA (US); Danyang Qiao, Santa Clara, CA (US); Wenwei Wang, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/713,732

(22) Filed: Apr. 5, 2022

(65) Prior Publication Data

US 2022/0231437 A1    Jul. 21, 2022

Related U.S. Application Data

(62) Division of application No. 16/879,521, filed on May 20, 2020, now Pat. No. 11,362,447.

(51) Int. Cl.
| | |
|---|---|
| *H01R 12/70* | (2011.01) |
| *H05K 1/18* | (2006.01) |
| *H01R 12/71* | (2011.01) |
| *H01R 12/73* | (2011.01) |

(52) U.S. Cl.
CPC ..... *H01R 12/7088* (2013.01); *H01R 12/7082* (2013.01); *H01R 12/716* (2013.01); *H01R 12/73* (2013.01); *H05K 1/181* (2013.01); *H05K 2201/10015* (2013.01); *H05K 2201/10189* (2013.01); *H05K 2201/10325* (2013.01)

(58) Field of Classification Search
CPC ............ H01R 12/7088; H01R 12/7082; H01R 12/716; H05K 1/181; H05K 2201/10015; H05K 2201/10189; H05K 2201/10325
USPC .......................................................... 361/782
See application file for complete search history.

(56) References Cited

U.S. PATENT DOCUMENTS

| | | | | |
|---|---|---|---|---|
| 3,219,765 | A  * | 11/1965 | Pless ........................ | H04R 1/08 381/361 |
| 6,545,850 | B1 * | 4/2003 | Shearman ............ | H05K 7/1457 361/119 |
| 8,514,565 | B2 * | 8/2013 | Foo ........................ | G06F 1/1635 361/764 |
| 10,199,977 | B1 * | 2/2019 | Mohammadpour ... | H05K 1/181 |
| 2019/0355515 | A1 * | 11/2019 | Li ........................ | H05K 7/1432 |
| 2019/0387628 | A1 * | 12/2019 | Kumagai ............. | H05K 3/3436 |

FOREIGN PATENT DOCUMENTS

EP            1255425 A2 *   11/2002       H05B 41/32

* cited by examiner

*Primary Examiner* — Andargie M Aychillhum
(74) *Attorney, Agent, or Firm* — IP & T Group LLP

(57) ABSTRACT

A detachable capacitor connection structure is provided for a storage device. In an embodiment, a connection element detachably connects a capacitor module including one or more capacitors to a circuit board such that the capacitor module is stacked over the circuit board. The connection element includes: a first connector including two pin headers, mounted on a bottom plane of the capacitor module; and a second connector including two sockets, mounted on a top plane of the circuit board corresponding to the bottom of the capacitor module, suitable for connecting the first connector to the circuit board.

6 Claims, 13 Drawing Sheets

Male Header

Female Socket

STORAGE DEVICE WITH DETACHABLE CAPACITOR CONNECTION STRUCTURE

CROSS-REFERENCE TO RELATED APPLICATION(S)

This application is a division of U.S. patent application Ser. No. 16/879,521 filed on May 20, 2020, which is here in incorporated by reference in its entirety.

BACKGROUND

1. Field

Embodiments of the present disclosure relate to schemes for connecting capacitors to a storage device.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

A data storage device includes a power supply. The power supply may be implemented with one or more capacitors.

SUMMARY

Aspects of the present invention include a storage device having a detachable capacitor connection structure.

In one aspect, a storage device includes: a circuit board; a capacitor module including one or more capacitors; and a connection element for detachably connecting the capacitor module to the circuit board such that the capacitor module is stacked over the circuit board. The connection element includes: a first connector including two pin headers, mounted on a bottom plane of the capacitor module; and a second connector including two sockets, mounted on a top plane of the circuit board corresponding to the bottom of the capacitor module, suitable for connecting the first connector to the circuit board.

In another aspect, a storage device includes a circuit board, a capacitor module including one or more capacitors, and a connection element for detachably connecting the capacitor module to the circuit board. The connection element includes: fingers disposed on at least one edge of the capacitor module; and a connector mounted on a portion of the circuit board accessible to the edge of the capacitor module and suitable for connecting the fingers to the circuit board.

In still another aspect, a storage device includes: a circuit board including two through holes; a capacitor including two pins; and a connection element for detachably connecting the capacitor to the circuit board. The connection element includes: a header including two right angle pins connected to the two through holes, respectively; and a socket connected to the header such that the two pins of the capacitor are guided to be connected to the two through holes, respectively.

Additional aspects of the present invention will become apparent from the following description.

DETAILED DESCRIPTION

Figure 1:
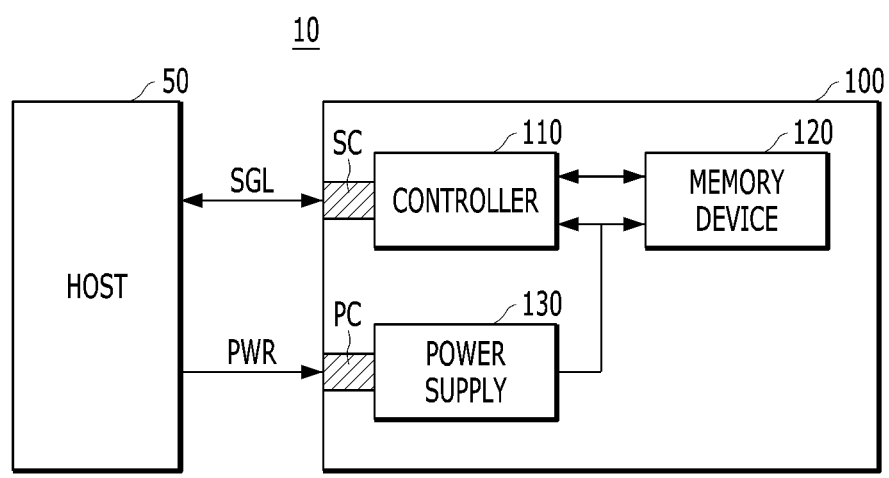
FIG. 1 is a block diagram illustrating an example of a data processing system.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram illustrating an example of a data processing system 10.

Referring to FIG. 1, the data processing system 10 may include a host device 50 and a storage device (or a memory system) 100. The storage device 100 may receive a request from the host device 50 and operate in response to the received request. For example, the storage device 100 may store data to be accessed by the host device 50.

The host device 50 may be implemented with any one of various kinds of electronic devices. In various embodiments, the host device 50 may include an electronic device such as a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 50 may include a portable electronic device such as a mobile phone, a smart phone, an e-book, an MP3 player, a portable multimedia player (PMP), and/or a portable game player.

The storage device 100 may include a controller 110, a memory device 120 and a power supply 130. The controller 110 may exchange a signal SGL with the host device 50 through a signal connector SC. The signal SGL may include a command, an address, and data. The signal connector SC may be configured as any of various types of connectors according to an interface scheme between the host device 50 and the storage device 100.

The controller 110 may control overall operation of the memory device 120 in response to a signal SGL from the host device 50. For example, the controller 110 may control the memory device 120 to perform one or more erase, program, and read operations.

The memory device 120 may be coupled to the controller 110 through one or more channels. The memory device 120 may be implemented with a plurality of nonvolatile memory devices. The controller 110 and the memory device 120 may be implemented with any one of various kinds of storage devices such as a solid state drive (SSD) and a memory card.

The power supply 130 may provide the inside of the storage device 100 with power PWR inputted through a power connector PC from the host device 50.

Figure 2:
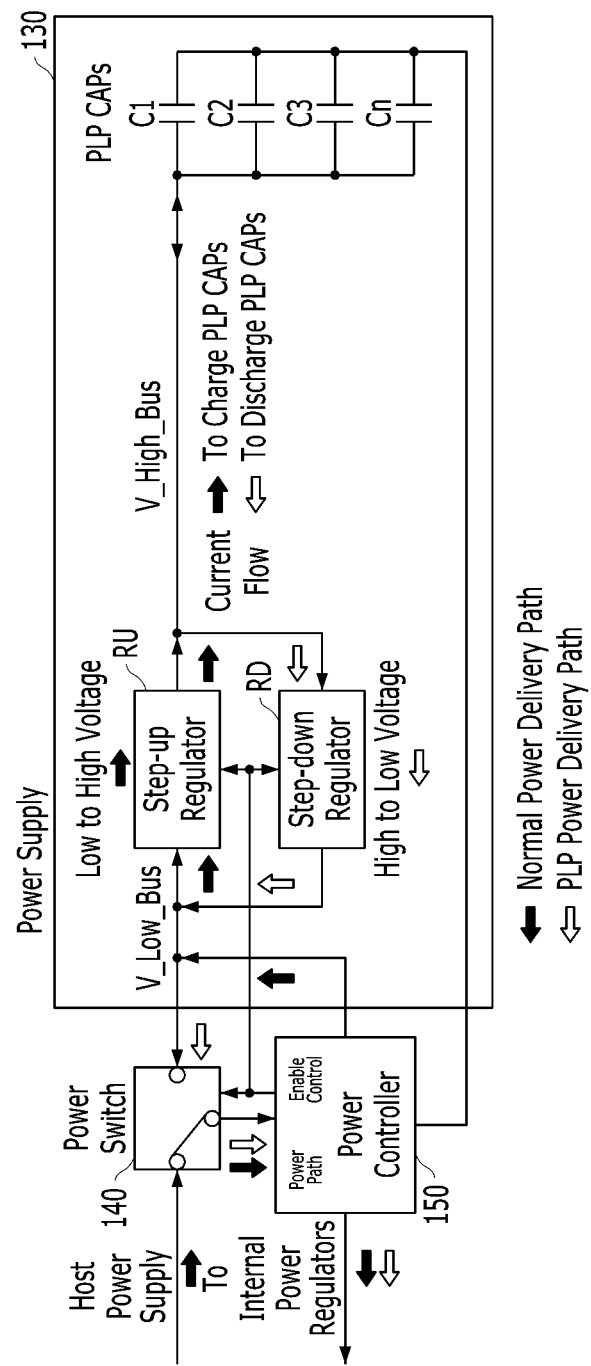
FIG. 2 is a diagram illustrating an example of a power supply for a storage device.

FIG. 2 is a diagram illustrating an example of the power supply 130 for the storage device 100.

Referring to FIG. 2, the power supply 130 may include a plurality of capacitors C1 to Cn, a voltage step-up regulator RU and a voltage step-down regulator RD. Although not shown in FIG. 1, the storage device 100 may further include a power switch 130 and a power controller 150 coupled to the power supply 130.

The power switch 130 may provide a normal power delivery path or a power loss protection (PLP) delivery path under control of the power controller 150. In the normal power delivery path, power provided from the host device 50 is delivered through the normal power delivery path including the power switch 140, the power controller 150, the voltage step-up regulator RU and the plurality of capacitors C1 to Cn. The voltage step-up regulator RU may convert a low input voltage from the host device 50 through the power switch 140 and the power controller 150 to a high voltage (e.g., 35V or more). The high voltage may be used to charge the plurality of capacitors C1 to Cn.

When the storage device 100 loses input power from the host device 50, the plurality of capacitors C1 to Cn may be discharged and the energy stored in the plurality of capacitors C1 to Cn may be delivered through the PLP delivery path including the voltage step-down regulator RD, the power switch 140, the power controller 150 and internal power regulators. The storage device 100 may use the plurality of capacitors (i.e., PLP capacitors) as a power source to back up all necessary data from an internal memory of the controller 110 (e.g., volatile memory) to the memory device 120 (e.g., NAND flash device).

As such, the plurality of capacitors C1 to Cn may form a capacitor array to provide sufficient energy to maintain power rail voltages for data back-up transfer from the controller 110 to the memory device. The capacitor array or a large bulk capacitor may serve as a power loss protection (PLP) capacitor for the storage device 100. In general, the capacitor array or the large bulk capacitor may be fixedly connected to a printed circuit board (PCB) of the storage device 100, e.g., by direct soldering. This type of connection poses a challenge to test and repair efforts in mass production and return merchandise authorization (RMA) operations. In other words, reflow and manual rework may be required to remove and replace failed capacitors. Accordingly, it is desirable to provide connection structures for connecting one or more capacitors to a circuit board of a storage device and easily replacing failed capacitors in storage devices.

Figure 3A:
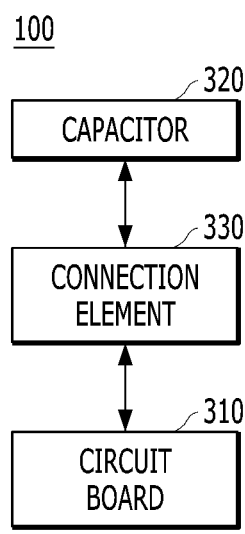
FIGS. 3A and 3B illustrate connection structures between one or more capacitors and a circuit board in a storage device in accordance with an embodiment of the present invention.
Figure 3B:
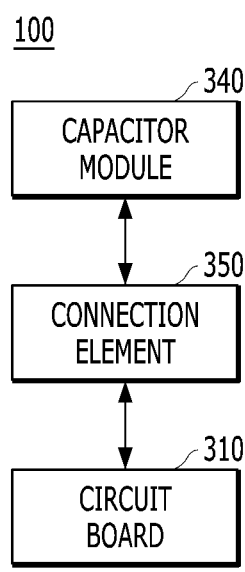

FIGS. 3A and 3B illustrate connection structures between one or more capacitors and a circuit board in accordance with an embodiment of the present invention.

Referring to FIG. 3A, a capacitor 320 may be detachably connected to a circuit board 310 of the storage device 100 through a connection element 330. In some embodiments, the capacitor 320 may be implemented with a through hole PLP capacitor (e.g., an aluminum (or aluminium) electrolyte capacitor) and the connection element 330 may include connection structures as shown in FIGS. 4A to 7.

Referring to FIG. 3B, a capacitor module 340 may be detachably connected to the circuit board 310 through a connection element 350. In some embodiments, the capacitor module 340 may be implemented with a surface mount PLP capacitor array (e.g., polymer tantalum solid capacitors) and the connection element 330 may include connection structures as shown in FIGS. 8A to 9B.

Figure 4A:
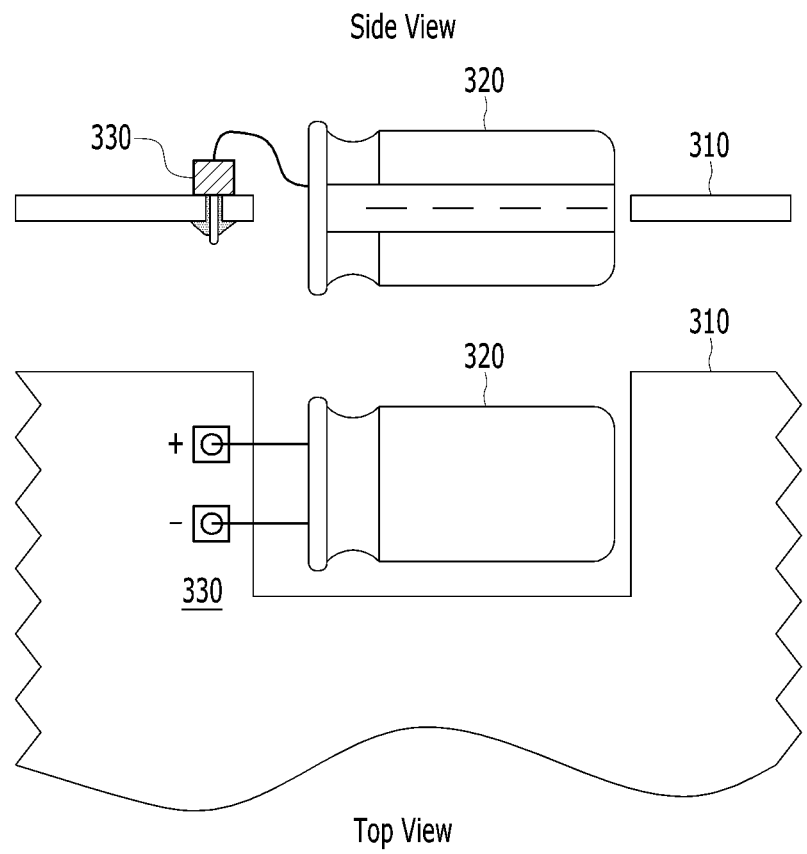
FIGS. 4A to 9C are diagrams illustrating a storage device having a detachable capacitor connection structure in accordance with embodiments of the present invention.
Figure 4B:
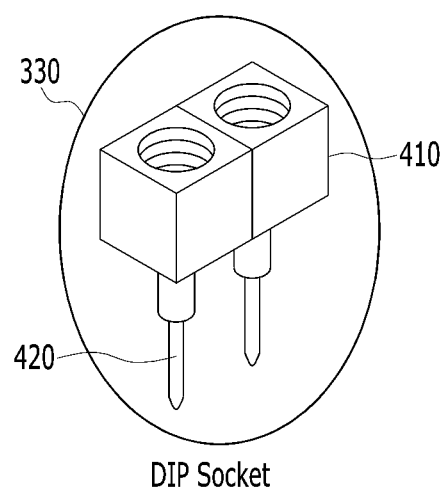

FIGS. 4A and 4B are diagrams illustrating the storage device 100 having a detachable capacitor connection structure in accordance with an embodiment of the present invention.

Referring to FIG. 4A, the storage device 100 may include the circuit board 310 and the capacitor 320, as shown in FIG. 3A. The capacitor 320 may include two pins (+)(−). In some embodiments, the capacitor 320 may be implemented with an aluminum electrolytic capacitor.

The connection element 330 may be implemented with a dual in-line package (DIP) socket as shown in FIG. 4B. The DIP socket may have a rectangular housing 410 with two through holes (shown at the top of the housing 410 in FIG. 4B) and two parallel pins 420, which extend into the two through holes of the housing 410, as shown in FIG. 4B. The parallel pins 420 may then be mounted on the circuit board 310. In an embodiment, the parallel pins 420 may be inserted into two through holes of the circuit board 310, respectively, to mount the capacitor 320 to the circuit board 310.

With the two pins (+)(−) of the capacitor 320 inserted into two through holes of the DIP socket, the DIP socket may detachably connect the two pins (+)(−) of the capacitor 320 to the circuit board 310, respectively. In the illustrated instance of FIGS. 4A and 4B, the DIP socket is vertically mounted on the circuit board 310 and the capacitor 320 is horizontally arranged to the circuit board 310. Thus, the two pins (+)(−) of the capacitor 320 may be bent in approximately 90 degrees and inserted into two through holes of the DIP socket.

Figure 5A:
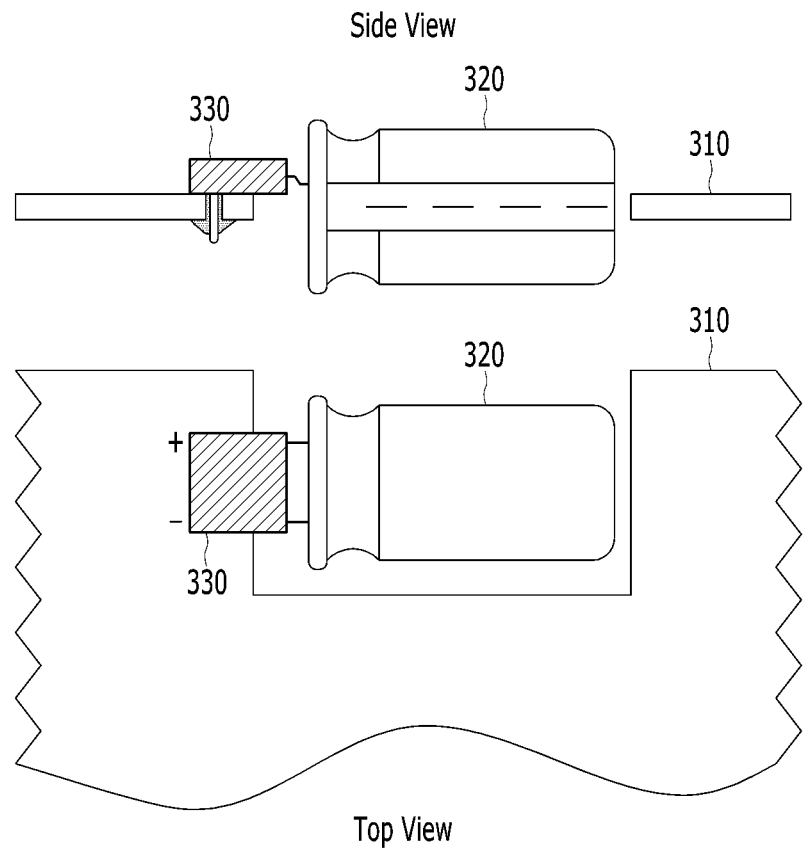
Figure 5B:
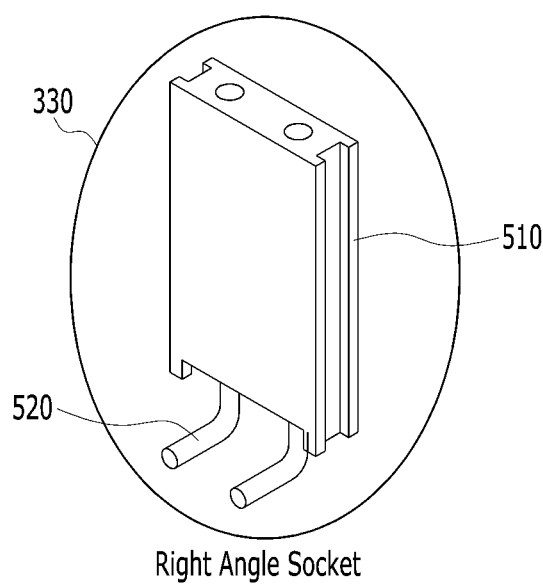

FIGS. 5A and 5B are diagrams illustrating the storage device 100 having a detachable capacitor connection structure in accordance with an embodiment of the present invention.

Referring to FIG. 5A, the storage device 100 may include the circuit board 310 and the capacitor 320, as shown in FIG. 3A. The capacitor 320 may include two pins (+)(−). In some embodiments, the capacitor 320 may be implemented with an aluminum electrolytic capacitor.

The connection element 330 may be implemented with a right angle socket as shown in FIG. 5B. The right angle socket may have a rectangular housing 510 with two through holes and two parallel right angle pins 520. A straight portion of the right angle pins 520 are held within the two through holes of the housing 510, and a bent portion of the right angle pins 520 protrude from the two through holes. The protruding portion of the parallel right angle pins 520 may be mounted on the circuit board 310. In an embodiment, the parallel right angle pins 520 may be mounted into two through holes of the circuit board 310, respectively.

With the two pins (+)(−) of the capacitor 320 inserted into two through holes of the right angle socket, the right angle socket may detachably connect the two pins (+)(−) of the capacitor 320 to two through holes of the circuit board 310, respectively. In the illustrated instance of FIGS. 5A and 5B, the parallel right angle pins 520 are vertically mounted to the circuit board 310 whereas the rectangular housing 510 and the capacitor 320 are horizontally arranged to the circuit board 310. Thus, the two pins (+)(−) of the capacitor 320 may be inserted into two through holes of the right angle socket without bending, compared to the instance of FIGS. 4A and 4B.

Figure 6A:
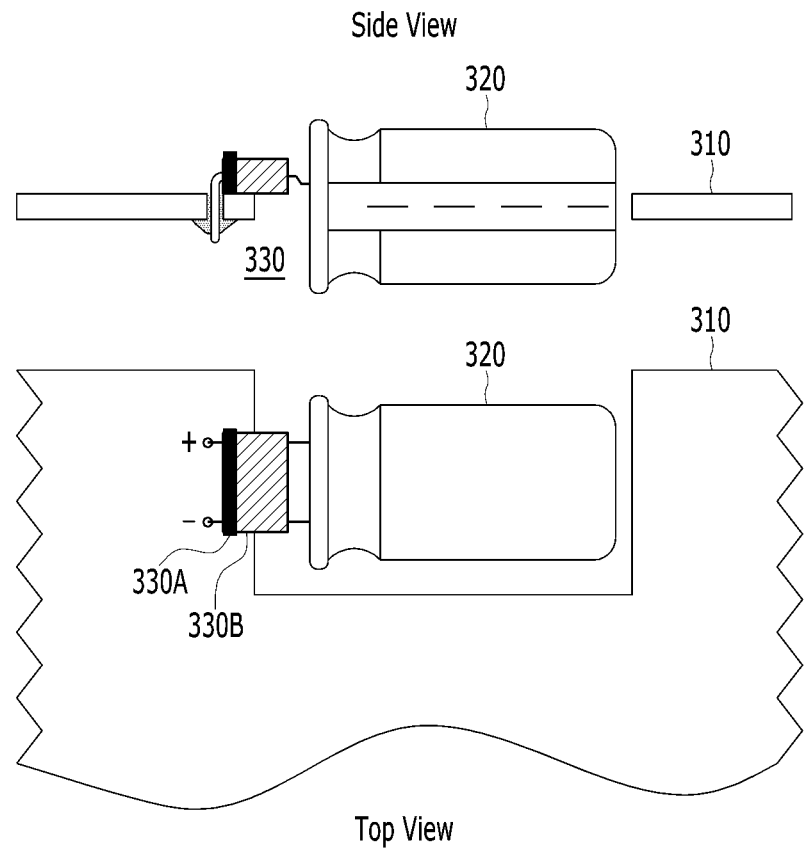
Figure 6B:
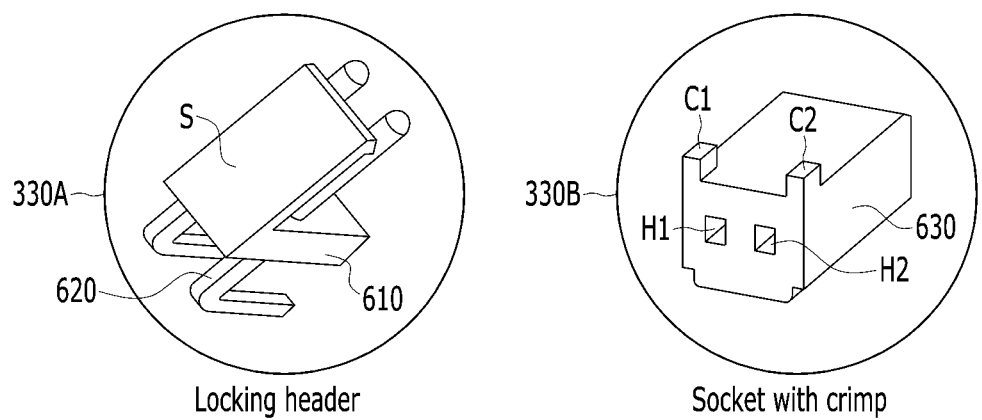
Figure 6C:
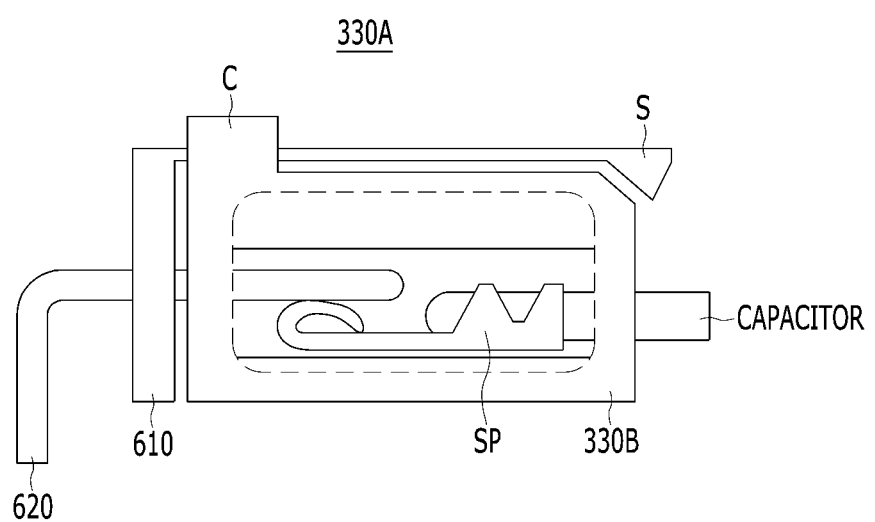

FIGS. 6A to 6C are diagrams illustrating the storage device 100 having a detachable capacitor connection structure in accordance with an embodiment of the present invention.

Referring to FIG. 6A, the storage device 100 may include the circuit board 310 and the capacitor 320, as shown in FIG. 3A. The capacitor 320 may include two pins (+)(−). In some embodiments, the capacitor 320 may be implemented with an aluminum electrolytic capacitor.

The connection element 330 may include a header 330A and a socket 330B as shown in FIG. 6B. The header 330A may include a housing 610 and two parallel right angle pins 620. The housing 610 may include two through holes, into which the two parallel right angle pins 620 are inserted. The parallel right angle pins 620 may be mounted on the circuit board 310. In an embodiment, the parallel right angle pins 620 may be mounted into two through holes of the circuit board 310, respectively.

The header 330A and the socket 330B may have a connection structure, through which they are interlocked with each other. For this structure, the housing 610 of the header 330A may include a sleeve S. The sleeve S may be formed in a direction perpendicular to the body of the housing 610. The socket 330B may include a housing 630 with two through holes H1,H2 and a crimp structure C1,C2. The two through holes H1,H2 may be formed at the center of the housing 630 in a set direction. The crimp structure C1,C2 may protrude from a top portion of the housing 630 such that an opening is formed between the crimp structure C1 and C2. In other words, the header 330A may be a locking header and the socket 330B may be implemented with a crimp housing. When the header 330A is installed or interlocked to the socket 330B, the sleeve S of the header 330A may be inserted through the opening between the crimp structure C1,C2 of the socket 330B. As such, the crimp structure C1,C2 may guide a correct installation between the header 330A and the socket 330B. This interlocking structure may prevent wrong installation between the header 330A and the socket 330B. Details of connection or mating between the header 330A and the socket 330B are shown in FIG. 6C. As shown in FIG. 6C, the right angle pins 620 of the header 330A may be connected to pins of the capacitor through pins SP of the socket 330B.

After the header 330A and the socket 330B are interlocked each other, with the two pins (+)(−) of the capacitor 320 inserted into two through holes of the socket 330B, the connection element 330 may detachably connect the two pins (+)(−) of the capacitor 320 to the circuit board 310, respectively. In the illustrated instance of FIG. 6, the parallel right angle pins 620 are vertically mounted to the circuit board 310 whereas the header 330A, the socket 330B and the capacitor 320 are horizontally arranged to the circuit board 310. Thus, the two pins (+)(−) of the capacitor 320 may be inserted into two through holes of the socket 330B without bending, compared to the instance of FIGS. 4A and 4B.

Figure 7:
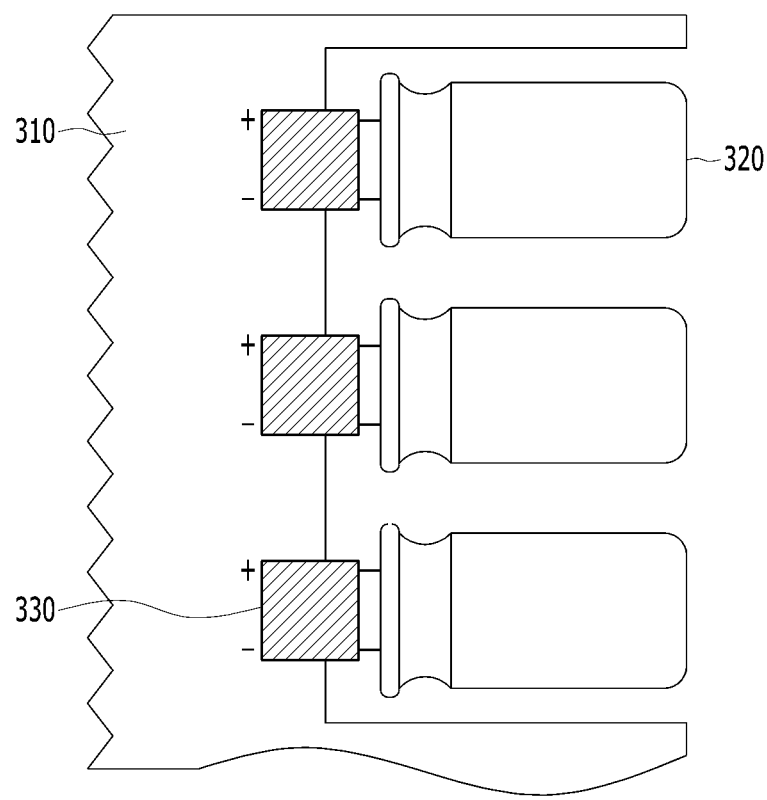

FIG. 7 illustrates a detachable capacitor connection structure in the storage device 100 having a plurality of capacitors 320 in accordance with an embodiment of the present invention.

Referring to FIG. 7, the plurality of capacitors 320, forming an array, may be connected to the circuit board 310 through a plurality of connection elements 330, respectively. In some embodiments, each of the connection elements 330 may have the same connection structure as shown in FIGS. 4A to 6B.

Figure 8A:
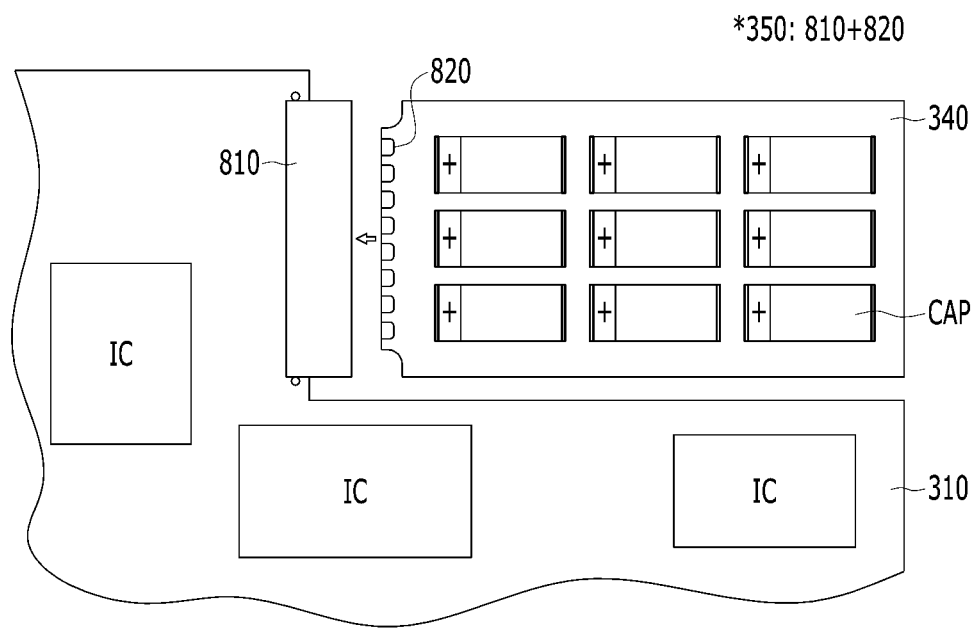
Figure 8B:
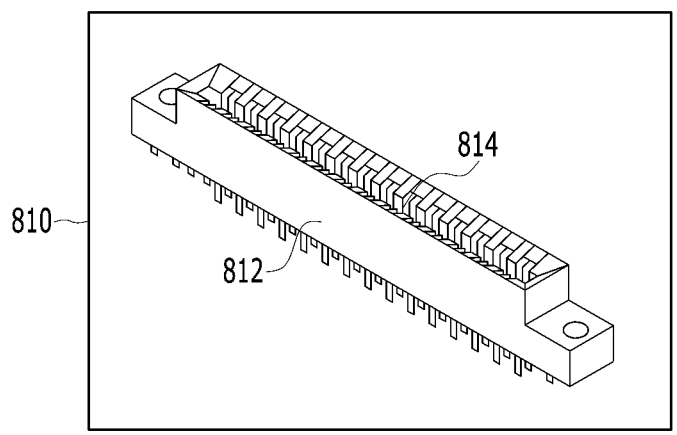
Figure 8C:
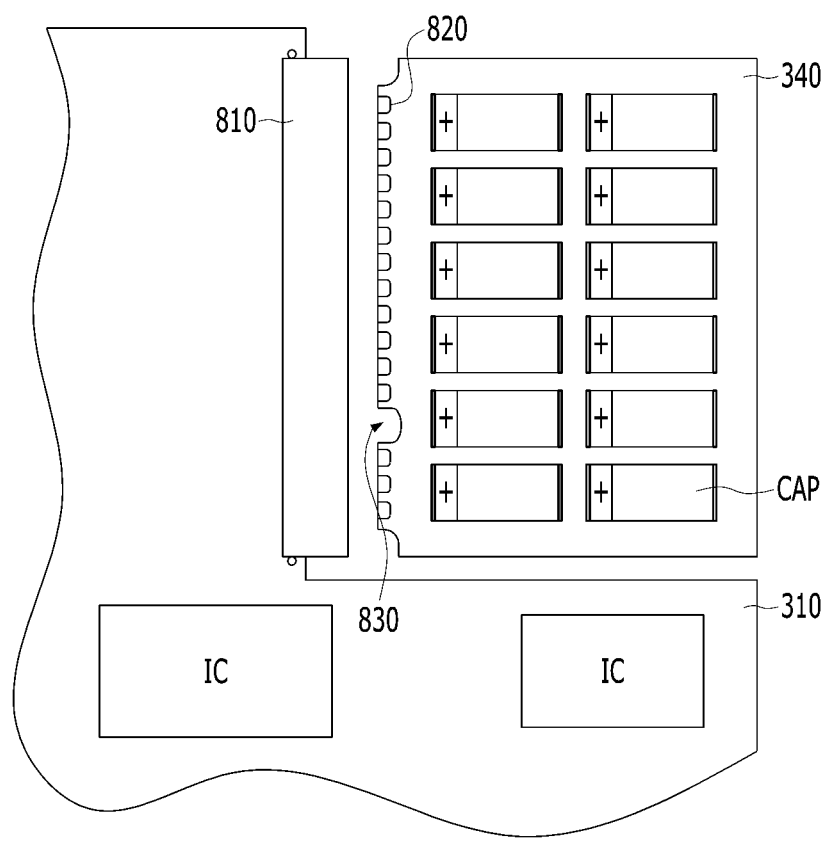

FIGS. 8A to 8C are diagrams illustrating the storage device 100 having a detachable capacitor connection structure in accordance with an embodiment of the present invention.

Referring to FIG. 8A, the storage device 100 may include the circuit board 310 and the capacitor module 340, as shown in FIG. 3B. The circuit board 310 may include one or more integrated chips (ICs). The capacitor module 340 may include one or more capacitors CAPs in an array. In some embodiments, the capacitors CAPs may be mounted on a top plane (or surface) of the capacitor module 340, and each capacitor may be implemented with a polymer tantalum solid capacitor.

A connector 810 and fingers 820, as the connection element 350, may detachably connect the capacitor module 340 to the circuit board 310. The fingers 820 may be disposed on at least one edge of the capacitor module 340. In some embodiments, the fingers 820 may be implemented with gold fingers. The connector 810 may be mounted on a portion of the circuit board 310 that is accessible to the edge of the capacitor module 340. The fingers 820 may be inserted into the connector 810 of the circuit board 310.

The connector 810 may be implemented with a female socket as shown in FIG. 8B. The female socket may include a housing 812 and one or more pins 814. The housing 812 may include one or more recessed holes, in which the pins 814 are installed. The pins 814 may be mounted on the portion of the circuit board 310. When the fingers 820 are inserted into the recessed holes of the housing 812, the connector 810 may connect the capacitors CAPs to the portion of the circuit board 310 through the fingers 820 and the pins 814.

Referring to FIG. 8C, the capacitor module 340 may further include a notch (or key) 830. The notch 830 may be formed on a portion of the edge of the capacitor module 340, in which the fingers 820 are formed. The portion of the edge may be positioned between two fingers among the fingers 820, as shown in FIG. 8B. The notch 830 may prevent wrong installation between the fingers 820 and the connector 810. In some embodiments, the dimension of the capacitor module 340, as the add-on card module, may be optimized to increase the insertion force against gravity.

Figure 9A:
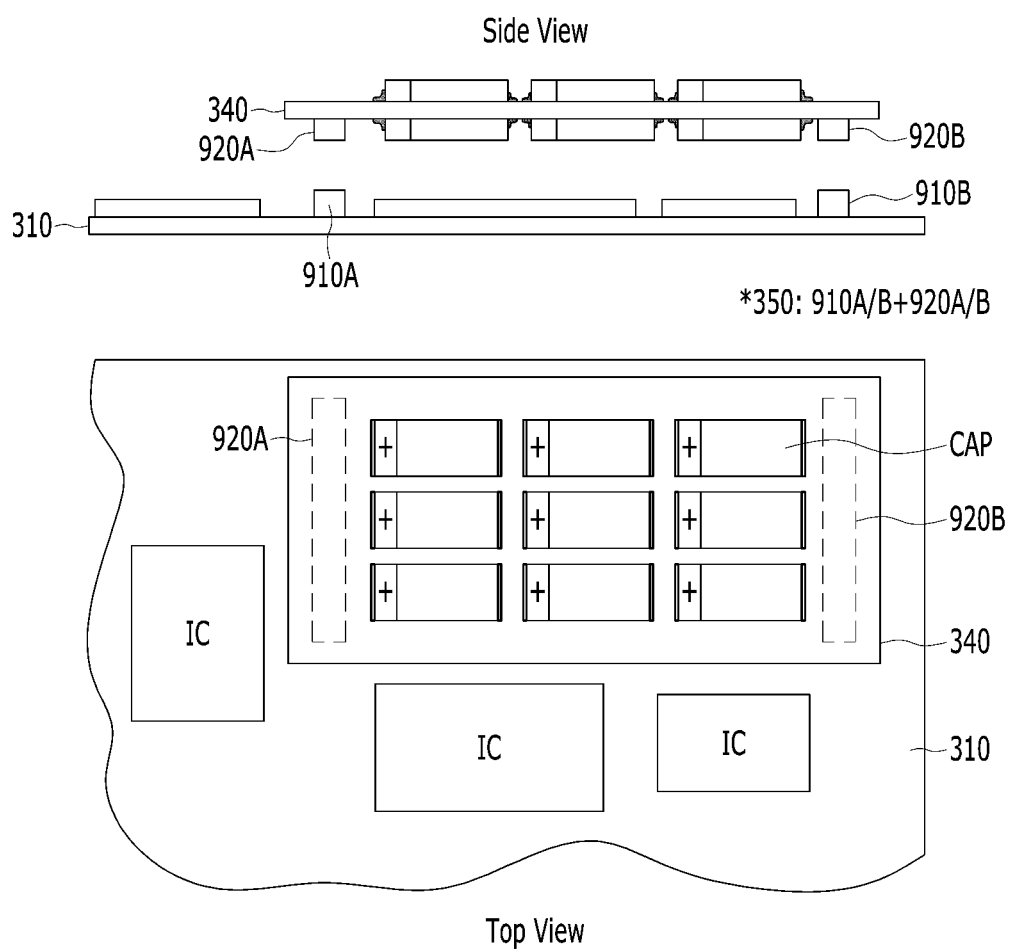
Figure 9B:
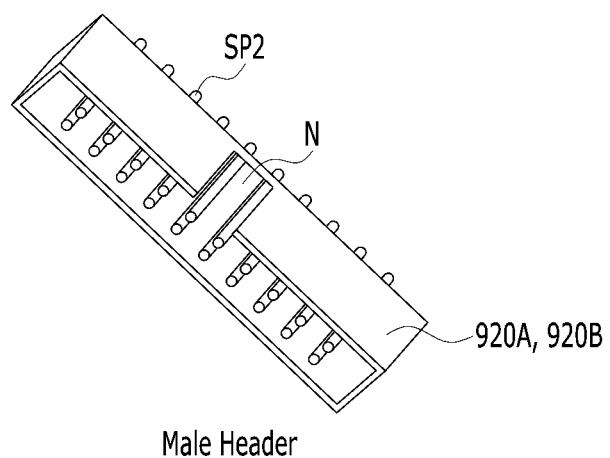
Figure 9B:
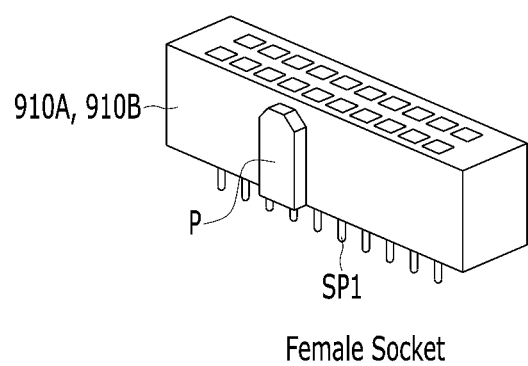
Figure 9C:
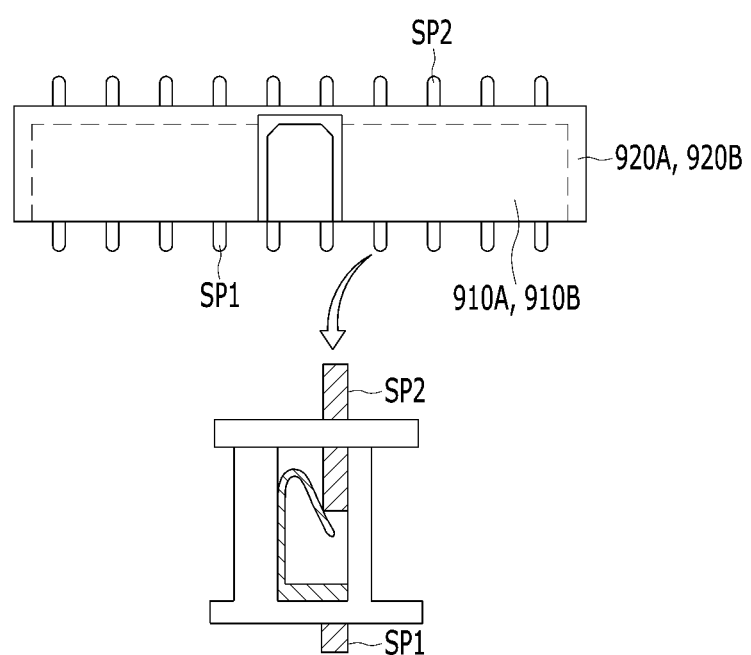

FIGS. 9A to 9C are diagrams illustrating the storage device 100 having a detachable capacitor connection structure in accordance with an embodiment of the present invention.

Referring to FIG. 9A, the storage device 100 may include the circuit board 310 and the capacitor module 340, as shown in FIG. 3B. The circuit board 310 may include one or more integrated chips (ICs). The capacitor module 340 may include one or more capacitors CAPs in an array. In some embodiments, the capacitors CAPs may be mounted on a top plane (or surface) and/or a bottom plane of the capacitor module 340, and each capacitor may be implemented with a polymer tantalum solid capacitor. In the illustrated example, the capacitors CAPs are mounted on the top and bottom planes of the capacitor module 340.

The connection element 350 may detachably connect the capacitor module 340 to the circuit board 310 such that the capacitor module 340 is stacked over the circuit board 310. The connection element 350 may include two pin headers 920A, 920B as a first connector and two sockets 910A, 910B as a second connector.

The two pin headers 920A, 920B may be mounted on a bottom plane (or surface) of the capacitor module 340. The two pin headers 920A,920B may be mounted on left and right sides of the bottom plane of the capacitor module 340, respectively, as shown in FIG. 9A. In some embodiments, the pin headers 920A, 920B may be implemented with male pin headers as shown in FIG. 9B.

The two sockets 910A, 910B may be mounted on a top plane of the circuit board 310 corresponding to the bottom plane of the capacitor module 340 such that the two pin headers 920A, 920B are connected to the circuit board 310. In some embodiments, the two sockets 910A, 910B may be implemented with female sockets and the two pin headers 920A, 920B may be implemented with male headers, as shown in FIG. 9B. The two sockets 910A, 910B may be mounted on left and right sides of the top plane of the circuit board 310, respectively, which correspond to the left and right sides of the bottom plane of the capacitor module 340. Each socket 910A, 910B may include a housing with multiple connection pins SP1. Each pin header 920A, 920B may include a housing with multiple connection pins SP2. In some embodiments, the two sockets 910A, 910B and the two pin headers 920A, 920B have a non-symmetrical structure to prevent wrong installation, as shown in FIG. 9B. In some embodiments, each of the two pin headers 920A, 920B has a notch portion N and each of the two sockets 910A, 910B has a protruding portion P. The protruding portion P and the notch portion N may be formed at set portions. For example, the protruding portion P may be formed at a center portion in one side of a housing of each socket 910A, 910B. The notch portion N may be formed at a center portion in one side of a housing of each pin header 920A, 920B. When each pin header 920A, 920B is inserted into each socket 910A, 910B, the protruding portion P may be inserted into the notch portion N and the housing of each pin header 920A, 920B may encompass the housing of each socket 910A, 910B. As such, this structure may prevent wrong installation between each socket 910A, 910B and each pin header 920A, 920B. Details of connection or mating between each socket 910A, 910B and each pin header 920A, 920B are shown in FIG. 9C. As shown in FIG. 9C, when the two pin headers 920A, 920B are inserted to the two sockets 910A, 910B, the pin SP1 of each socket 910A, 910B may be connected to the pin SP2 of each pin header 920A, 920B such that the capacitors CAPs of the capacitor module 340 are connected to the circuit board 310 through the connection of pins SP2 and pins SP1.

As described above, embodiments provide a detachable capacitor connection structure for detachably connecting one or more capacitors to a circuit board in a storage device.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the claims.

What is claimed is:

1. A data storage device comprising: a circuit board including two through holes; a capacitor for providing power to the storage device, the capacitor including two pins; and a connection element for detachably connecting the capacitor to the circuit board, wherein the connection element includes: a header including two right angle pins connected to the two through holes, respectively; and a socket connected to the header such that ends of the right angle pins enter into a socket housing and connect inside the socket housing to the two pins of the capacitor, wherein the header comprises a sleeve which is insertable into a crimp structure on the socket housing.

2. The data storage device of claim 1, wherein the header includes the two right angle pins and a header housing with a sleeve and two through holes, into which the two right angle pins are inserted.

3. The data storage device of claim 2, wherein the socket includes two holes connected to the two right angle pins and a crimp locked to the sleeve.

4. The data storage device of claim 1, wherein the capacitor includes an aluminum electrolytic capacitor.

5. The data storage device of claim 1, wherein the crimp structure comprises a pair of protrusions a) protruding from the socket housing and b) into which the sleeve inserts.

6. The data storage device of claim 1, wherein the socket housing comprises holes for the ends of the right angle pins to insert into the socket housing.

* * * * *